United States Patent [19]

Dearnaley

[11] Patent Number: 5,759,904
[45] Date of Patent: Jun. 2, 1998

[54] SUPPRESSION OF TRANSIENT ENHANCED DIFFUSION IN ION IMPLANTED SILICON

[75] Inventor: Geoffrey Dearnaley, San Antonio, Tex.

[73] Assignee: Southwest Research Institute, San Antonio, Tex.

[21] Appl. No.: 746,108

[22] Filed: Nov. 6, 1996

[51] Int. Cl.$^6$ ................................................ H01L 21/265
[52] U.S. Cl. .................................................. 438/528
[58] Field of Search ........................... 437/24, 26, 29, 437/46; 148/DIG. 959; 438/510, 511, 514, 918, 519, 528, 527, 158

[56] References Cited

U.S. PATENT DOCUMENTS

| | | | |
|---|---|---|---|
| 4,762,802 | 8/1988 | Parrillo | 437/24 |
| 5,198,371 | 3/1993 | Li | 437/24 |
| 5,286,660 | 2/1994 | Chiou et al. | 437/24 |
| 5,503,756 | 4/1996 | Yoshinouchi et al. | 437/24 |
| 5,523,445 | 6/1996 | Fuse | 437/24 |
| 5,559,043 | 9/1996 | Bruel | 437/24 |
| 5,585,286 | 12/1996 | Arnowitz et al. | 437/24 |

FOREIGN PATENT DOCUMENTS

| | | | |
|---|---|---|---|
| 2-34937 | 2/1990 | Japan | 437/24 |
| 5-102161 | 4/1993 | Japan | 437/24 |

OTHER PUBLICATIONS

Simon Romani, "Isolation of Silicon by Implantation of Hydrogen, Helium Oxygen: A Structural and Electrical Investigation," *A dissertation submitted by Simon Romani to the University of Wales, College of Cardiff* (Mar. 1991).

T.H. Huang et al "Influence of Fluorine Preamorahization on Diffusion and Activation of Low Energy Implanted Boron During Rapid Thermal Annealing", Appl. Phys. Lett. 65(14) 3 Oct. 1994.

*Primary Examiner*—John Niebling
*Assistant Examiner*—S. Mulpuri
*Attorney, Agent, or Firm*—Madan & Morris, PLLC

[57] ABSTRACT

The present invention provides a method for suppressing transient enhanced diffusion of ion implanted dopants in a semiconductor substrate comprising bombarding the substrate in a vacuum with a beam of bubble-forming ions at a first temperature, a first energy, and a first ion dose sufficient to form a dispersion of bubbles at a depth equivalent to a peak of damage distribution in the substrate from implantation of dopant ions into the substrate in a vacuum at a second temperature, a second energy, and a second ion dose, said dispersion being sufficient to reduce said damage distribution.

22 Claims, No Drawings

SUPPRESSION OF TRANSIENT ENHANCED DIFFUSION IN ION IMPLANTED SILICON

FIELD OF THE INVENTION

The present invention relates to the field of semiconductors and semiconductor processing. More particularly, the invention relates to methods for suppressing transient enhanced diffusion of ion implanted dopant in silicon during thermal annealing using a controlled distribution of sinks or centers which act as traps for silicon interstitials.

BACKGROUND OF THE INVENTION

With the continuing trend toward smaller microelectronic devices, the need has arisen to reduce junction depths to between about 70–100 nm. One problem that has interfered with achieving such junction depths is transient enhanced diffusion (TED). TED is the redistribution of dopant during the thermal annealing step that follows ion implantation of the dopant into silicon.

Ion implantation is the preferred means to introduce dopant species, such as boron or arsenic, into a silicon substrate. Unfortunately, the atomic collisions that occur during ion implantation create many point defects, vacancies, or interstitials. Some of these agglomerate into small extended defects, such as rod-like interstitial defects that tend to orient along the (113) crystal direction. During the thermal annealing step, the interstitials that are released from such agglomerations promote a rapid redistribution of boron atoms. The redistribution results because the silicon interstitial interacts with a substitutional boron atom, replacing the boron atom and producing a highly mobile boron interstitial. The resulting redistribution of dopant is known as transient enhanced diffusion.

Transient enhanced diffusion makes it difficult, if not impossible, to control boron depth distribution—and thus junction depth—by simply reducing the boron ion energy (and thus the ion range). Lateral enhanced diffusion also carries dopant from the source and drain regions into the gate, affecting the gate width in a poorly-controlled manner.

A cost-effective method to eliminate or substantially reduce transient enhanced diffusion is needed.

SUMMARY OF THE INVENTION

The present invention provides a method for suppressing transient enhanced diffusion of ion implanted dopants in a semiconductor substrate comprising bombarding the substrate in a vacuum with a beam of bubble-forming ions at a first temperature, a first energy, and a first ion dose sufficient to form a dispersion of bubbles at a depth equivalent to a peak of damage distribution in the substrate from implantation of dopant ions into the substrate in a vacuum at a second temperature, a second energy, and a second ion dose, said dispersion being sufficient to reduce said damage distribution.

DETAILED DESCRIPTION OF THE INVENTION

The present invention involves a treatment for semiconductor substrates, including, but not necessarily limited to silicon and gallium arsenide, preferably silicon. According to the present invention, the semiconductor substrate is bombarded with ions that will form bubbles close to the surface of the semiconductor substrate. Ions suitable for use in the present invention include, but are not necessarily limited to helium or hydrogen ions, preferably helium ions.

The ions are implanted into the substrate, preferably a silicon substrate, to form a controllable distribution of sinks or centers that act as powerful traps for defects in the substrate, preferably silicon interstitials, created by the implantation of dopant. Silicon interstitials effectively disappear into the sinks or centers. The sinks or centers are voids or cavities with a typical diameter of a few nanometers. Defects such as silicon interstitials are trapped at the surface of the cavity, making the cavity progressively smaller.

The sinks or voids are the result of bubbles that are created by the implantation of "bubble-forming" ions into the substrate. Suitable "bubble-forming" ions include, but are not necessarily limited to, hydrogen and helium. Heavy ions, such as neon or argon, are not suitable "bubble-forming" ions because heavy ions induce additional damage in the substrate.

Helium ions are preferred "bubble-forming" ions for several reasons. First, helium has the ability to stabilize three-dimensional voids in semiconductor substrates. Second, hydrogen appears to react chemically with silicon substrates, forming hydrides in a platelet structure. Therefore, hydrogen could interfere with the electronic properties of the ion-implanted dopant atoms. In contrast, at annealing temperatures above 600 C., most of the helium ions will be released by diffusion to the surface of the substrate, leaving empty voids in their place.

The size and distribution of the bubbles and/or voids is determined by the ion dose, the ion energy, and the implantation temperature employed to implant the "bubble-forming" ions. By optimal choice of bubble/void size and distribution, the interstitials created during ion implantation, e.g., with boron, can just fill the voids, leaving an essentially defect-free substrate. The total volume of the voids should be such that they can accommodate all of the substrate atoms (preferably silicon interstitials) that have been or will be knocked out of place by the implantation of dopant ions. Where the dopant is boron and the substrate is silicon, each boron ion should displace about 1.4 silicon atoms; therefore, the voids preferably should have a total volume that will accommodate between about 2–3 silicon interstitials per boron ion. Helium-induced voids have a stronger affinity for silicon interstitials than the silicon interstitials have for one another. As a result, extended silicon interstitial defects should not form, or should be substantially reduced. Any helium that remains in the substrate after the thermal annealing step should not interfere with the functioning of the microelectronic device because helium is not electrically active in semiconductor substrates, such as silicon.

Although the invention is described herein with reference to boron as the dopant, the invention also may be used with other dopants, including but not limited to boron, phosphorus, arsenic, antimony, and combinations thereof The sinks or voids of the present invention preferably should be formed prior to the ion implantation of boron or other dopant in order to form a shallow junction. However, the invention still should reduce defects in a substrate even if dopant is implanted first and the void forming ions are implanted thereafter as long as both the dopant and the voids are present during the thermal annealing step.

In a preferred embodiment, the appropriate masks for the dopant implantation are formed and the silicon wafer first is implanted with helium ions at a temperature below about 250 C. in a vacuum of about $10^{-5}$ torr. The implant energy of the helium ions should be chosen so that the range of the helium ions corresponds to the depth at which damage produced by the subsequent implantation of dopant, preferably boron, will be at a maximum.

For example, if the dopant is boron, and the energy of the boron ion implantation will be 20 keV, the boron projected range will be about 66 nm and the peak of the damage distribution will lie at a depth of about 50 nm. In order to penetrate to a depth of about 50 nm, the energy at which the substrate is bombarded with helium ions should be about 6 keV. Persons of ordinary skill in the art will be able to use published tables of ion ranges in order to arrive at preferred ion energies. An example of such a table is found in *Projected Range Statistics*, J. Gibbons, W. Johnson, and S. Mylroie (2d Ed., Halsted Press, a division of John Wiley & Sons, Inc. 1975), incorporated herein by reference. In most cases, the depth of damage distribution should not exceed about 400 nm.

The implantation of any voids at all should improve the quality of the final product. In order to produce an optimal volume of void cavities, the helium ion dose preferably should be between about 2–10 times the boron ion dose. Thus, if the boron ion dose is $10^{16}$ ions per cm$^2$, the dose of helium ions preferably should be between about $2 \times 10^{16}$ and $10^{17}$ ions per cm$^2$, most preferably about $4 \times 10^{16}$ ions per cm$^2$.

The voids that are formed using the present process will have a diameter between about 2–20 nm, typically about 10 nm, and will be spaced approximately 20 to 30 nm apart. The reason for maintaining the temperature below about 250 C. during helium ion implantation is to avoid coarsening the structure as a result of "Ostwald ripening"—a process by which larger bubbles grow at the expense of smaller ones. Preferably, the process should produce a very fine distribution of very small bubbles and voids. No heat treatment should be carried out during the interval between helium ion bombardment and the implantation of boron or some other chosen dopant species.

After the boron implantation step has been performed, thermal annealing should be carried out using known procedures. During the first few seconds of anneal, interstitials will be released from rod-like defects in the silicon crystal. The interstitials preferentially will be trapped by the bubbles and void cavities that have been generated by the helium ion bombardment. Substantially all of the helium should be released from the silicon crystal during this or subsequent thermal treatments.

Persons of ordinary skill in the art will recognize that many modifications may be made to the present invention without departing from the spirit and scope of the present invention. The embodiment described herein is meant to be illustrative only and should not be taken as limiting the invention, which is defined in the following claims.

I claim:

1. A method for suppressing transient enhanced diffusion of ion implanted dopants in a silicon substrate, comprising bombarding said substrate in a vacuum with a beam of helium ions under conditions comprising a temperature, an energy, and an ion dose, wherein said conditions are effective to form a dispersion of bubbles at a depth equivalent to a peak of damage distribution in said substrate due to ion implantation of dopant ions into said substrate, said dispersion being sufficient to reduce said transient enhanced diffusion without inducing additional damage in said substrate.

2. The method of claim 1 wherein said first temperature is about 250 C. or less.

3. The method of claim 1 wherein said dopant is boron.

4. The method of claim 1 wherein said first dose is between about 2–10 times said second dose.

5. The method of claim 4 wherein said voids are within about 400 nm of a surface of said substrate;

said voids are about 2–20 nm in diameter; and, said voids are spaced between about 20–30 nm apart.

6. The method of claim 1 wherein said substrate subsequently is thermally annealed.

7. A method for suppressing transient enhanced diffusion of ion implanted dopants in a semiconductor substrate comprising bombarding said substrate in a vacuum with a beam of bubble-forming ions selected from the group consisting of hydrogen ions and helium ions under conditions comprising a temperature, an energy, and an ion dose, wherein said conditions are effective to form a dispersion of bubbles at a depth equivalent to a peak of damage distribution in said substrate due to ion implantation of dopant ions into said substrate, said dispersion being sufficient to reduce said transient enhanced diffusion without inducing additional damage in said substrate.

8. The method of claim 7 wherein said substrate is silicon.

9. The method of claim 7 wherein said bombarding said substrate with bubble-forming ions occurs before said implantation of dopant ions into said substrate.

10. The method of claim 8 wherein said bombarding said substrate with bubble-forming ions occurs before said implantation of dopant ions into said substrate.

11. The method of claim 7 wherein said temperature is less than about 250 C.

12. The method of claim 9 wherein said first temperature is less than about 250 C.

13. The method of claim 10 wherein said first temperature is less than about 250 C.

14. The method of claim 7 wherein said dopant is boron.

15. The method of claim 8 wherein said dopant is boron.

16. The method of claim 11 wherein said dopant is boron.

17. The method of claim 7 wherein said dose is between about 2–10 times said dopant ion dose.

18. The method of claim 8 wherein said dose is between about 2–10 times said dopant ion dose.

19. The method of claim 11 wherein said dose is between about 2–10 times said dopant ion dose.

20. The method of claim 7 wherein said substrate subsequently is thermally annealed.

21. The method of claim 8 wherein said substrate subsequently is thermally annealed.

22. The method of claim 11 wherein said substrate subsequently is thermally annealed.

\* \* \* \* \*